United States Patent
Kono et al.

(10) Patent No.: US 8,294,118 B2
(45) Date of Patent: Oct. 23, 2012

(54) METHOD FOR ADJUSTING OPTICAL AXIS OF CHARGED PARTICLE RADIATION AND CHARGED PARTICLE RADIATION DEVICE

(75) Inventors: Akemi Kono, Hitachinaka (JP); Osamu Nasu, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/147,768

(22) PCT Filed: Jan. 13, 2010

(86) PCT No.: PCT/JP2010/000118
§ 371 (c)(1),
(2), (4) Date: Aug. 3, 2011

(87) PCT Pub. No.: WO2010/089950
PCT Pub. Date: Aug. 12, 2010

(65) Prior Publication Data
US 2011/0284759 A1    Nov. 24, 2011

(30) Foreign Application Priority Data
Feb. 3, 2009    (JP) ................................. 2009-022102

(51) Int. Cl.
*H01J 37/04*    (2006.01)
*H01J 37/22*    (2006.01)
*H01J 37/256*    (2006.01)

(52) U.S. Cl. .............. 250/396 R; 250/396 ML; 250/310; 250/311; 250/306; 250/307; 250/492.2; 250/492.3

(58) Field of Classification Search .............. 250/396 R, 250/396 ML, 306, 307, 310, 311, 492.2, 250/492.3
See application file for complete search history.

(56) References Cited

U.S. PATENT DOCUMENTS

| | | | |
|---|---|---|---|
| 6,570,156 B1 | 5/2003 | Tsuneta et al. | |
| 7,138,629 B2 * | 11/2006 | Noji et al. | 250/311 |
| 7,236,651 B2 * | 6/2007 | Ishitani et al. | 382/299 |
| 7,741,601 B2 * | 6/2010 | Noji et al. | 250/310 |
| 2003/0039386 A1 | 2/2003 | Ishitani et al. | |

FOREIGN PATENT DOCUMENTS

| | | |
|---|---|---|
| JP | 05-045265 | 2/1993 |
| JP | 11-224640 | 8/1999 |

(Continued)

*Primary Examiner* — Nikita Wells
(74) *Attorney, Agent, or Firm* — McDermott Will & Emery LLP

(57) ABSTRACT

Provided are a method for adjusting the optical axis of a charged particle beam and a device therefor, wherein an artificial criterion is quantified, and whether or not the adjustment of the axis of a charged particle beam is necessary is judged on the basis of the quantified criterion. In the method for adjusting the optical axis and the device therefor, the conditions for adjusting an optical element for adjusting a charged particle beam are changed; a plurality of images are captured under the changed conditions; images the qualities of which are allowed or images the qualities of which are not allowed are selected from the captured images; a first image quality evaluation value is obtained on the basis of the selected images; the obtained first image quality evaluation value is compared with a second image quality evaluation value obtained from images obtained by scanning an object using the charged particle beam; and the optical axis is adjusted when the second image quality evaluation value is equal to or below the first image quality evaluation value.

5 Claims, 11 Drawing Sheets

FOREIGN PATENT DOCUMENTS

| | | |
|---|---|---|
| JP | 2000-195453 | 7/2000 |
| JP | 2000-331637 | 11/2000 |
| JP | 2003-346690 | 12/2003 |
| JP | 2007-128913 | 5/2007 |
| JP | 2007-207763 | 8/2007 |
| JP | 2008-226536 | 9/2008 |

* cited by examiner

| DESIGNATION OF IMAGE | $I_{(0°)}$ | $I_{(90°)}$ | $I_{(180°)}$ | $I_{(270°)}$ | AVERAGE Ix |
|---|---|---|---|---|---|
| FIG. 5 | 20078 | 24199 | 16424 | 27648 | 22087 |
| FIG. 8 | 9604 | 6239 | 9055 | 6444 | 7835 |
| FIG. 10 | 29856 | 27944 | 28494 | 28823 | 28779 |

FIG.13

| MEASUREMENT POINT | MEASUREMENT RESULT | Ix |
|---|---|---|
| 1 | 102 | 31136 |
| 2 | 100 | 29354 |
| 3 | 101 | 30527 |
| 4 | 102 | 28843 |
| 5 | 103 | 29571 |
| 6 | 105 | 28915 |
| 7 | 104 | 31029 |
| 8 | 105 | 30960 |
| 9 | 102 | 31116 |
| 10 | 101 | 29499 |
| 11 | 100 | 30613 |
| 12 | 101 | 30129 |
| 13 | 104 | 29617 |
| 14 | 100 | 30888 |
| 15 | 103 | 31590 |
| 16 | 103 | 28877 |
| 17 | 102 | 31171 |
| 18 | 102 | 29550 |
| 19 | 80 | 28818 |
| 20 | 120 | 20000 |

METHOD FOR ADJUSTING OPTICAL AXIS OF CHARGED PARTICLE RADIATION AND CHARGED PARTICLE RADIATION DEVICE

RELATED APPLICATIONS

This application is the U.S. National Phase under 35 U.S.C. §371 of International Application No. PCT/JP2010/000118, filed on Jan. 13, 2010, which in turn claims the benefit of Japanese Application No. 2009-022102, filed on Feb. 3, 2009, the disclosures of which Applications are incorporated by reference herein.

TECHNICAL FIELD

The present invention relates to a method for adjusting an optical axis of a charged particle beam and a charged particle beam device and, more particularly, to a method for adjusting an optical axis in which an adjustment of the optical axis is judged on the basis of evaluation of images and to a charged particle beam device.

BACKGROUND ART

As methods for evaluation of resolution in charged particle microscopes (such as a Scanning Electron Microscope (SEM) and a scanning ion microscope), the followings have been known. A first method is a GAP method according to which a sample having gold particles vapor-deposited on carbon is observed with a microscope and a minimal gap distance between two points which can be confirmed with eyes on an observed image is used for evaluation as disclosed in Patent Literature 1. A second method is an FFT method in which, the frequency analysis by two-dimensional Fourier transform of data of an observed image is conducted and the image resolution is evaluated as described in Patent Literature 2. A third method is to evaluate the image resolution from a local contrast gradient in observed image data as disclosed in Patent Literature 3.

On the other hand, in a charged particle beam device represented by a scanning electron microscope, desired information (for example, a sample image) is obtained from a sample by scanning a finely focused charged particle beam on the sample. In such a charged particle beam device, when the optical axis misaligns to a lens, a lens aberration occurs to decrease the resolution of the sample image and, therefore, highly accurate axis adjustment is necessary for obtaining a sample image of high resolution. In the axis adjustment, the excitation current or the like of an objective lens is changed periodically and the operating conditions of a deflector for axis adjustment (aligner) is manually adjusted so as to minimize the movement at that time.

As a technique for conducting the above adjustment automatically, a technique disclosed in Patent Literature 4 is available. The description discloses a technique of changing the excitation set value of an alignment coil based on a shift of the electron beam irradiation position which changes between two excitation conditions of an objective lens. Further, Patent Literature 5 discloses a technique for performing focus correction based on a detected positional shift between two images of an electron microscope obtained under different optical conditions.

Furthermore, when an axially asymmetric aberration exists in the charged particle beam device, the focal point differs in longitudinal and lateral directions of an image and the image is blurred in a certain direction. This can be adjusted with a stigmator and the adjustment can be conducted automatically like the automatic axis adjustment. An ordinary user confirms with eyes that the image quality after automatic adjustment is satisfactory. If unsatisfactory, the adjustment will be executed again.

CITATION LIST

Patent Literature
   Patent Literature 1: JP-A-5-45265
   Patent Literature 2: JP-A-11-224640
   Patent Literature 3: JP-A-2007-128913
   Patent Literature 4: JP-A-2000-195453
   Patent Literature 5: JP-A-2000-331637

SUMMARY OF INVENTION

Technical Problem

In the scanning electron microscope, an optical axis misalignment and the development of an astigmatism resulting from aging variations of optical system components and the like degrade the optical condition and cause blurs of image to occur. Especially, in the scanning electron microscope used as a measuring instrument such as a critical dimension SEM, the aforementioned blur is responsible for generation of changes in measured dimensions. An image blur affects an image profile (a sectional waveform of an image) so that it changes. Since in the critical dimension SEM dimensions are measured from an image profile, a shift in optical conditions will cause the measured dimension to change. In order to prevent such a shift of optical conditions, the user of scanning electron microscope periodically corrects the axis misalignment and the astigmatism by using the automatic axis adjustment function.

Recently, in the semiconductor mass-production factory, automation of semiconductor fabrication apparatuses including measurement instruments, that is, an unattended system is demanded for the purpose of cost reduction and improved production efficiency. On the other hand, there prevails a request for confirming with eyes an image captured before or after completion of the axis adjustment to thereby confirm propriety of the axis adjustment.

The image resolution evaluation methods in Patent Literature 1 to 3 are widely known as the methods for evaluating the picture quality (resolution) of SEM images but, in the method as explained in Patent Literature 1, there is a possibility that a resolution evaluation value to be determined changes largely depending on a position of a selected gap and subjectivity of an SEM user becomes a factor for an error. Moreover, according to the techniques explained in Patent Literature 2 and 3, the resolution can be evaluated objectively but there is no room for judgment of an SEM user in the evaluation value.

Also in the axis adjustment method disclosed in either Patent Literature 4 or 5, there is no room for the judgment of an SEM user and it is difficult for an experienced judgment of the SEM user to be reflected on the picture quality evaluation or judgment as to whether the axis adjustment is necessary.

Charged particle beam optical axis adjustment method and device will be described hereinafter which aim at quantifying an artificial criterion and making a decision as to whether the axis adjustment of the charged particle beam is necessary on the basis of the quantified artificial criterion.

Solution to Problem

To accomplish the above objective, a method and a device are proposed in which adjustment conditions of an optical element adapted to adjust a charged particle beam is changed to capture a plurality of images with the adjustment conditions different, an image a quality of which is tolerable or an image a quality of which is intolerable is selected from the captured images, a first image quality evaluation value is obtained on the basis of the selected image, the obtained first image quality evaluation value is compared with a second image quality evaluation value obtained from an image captured by scanning the charged particle beam, and the optical axis is adjusted when the second image quality evaluation value is equal to or less than the first image quality evaluation value or is less than the first image quality evaluation value.

ADVANTAGEOUS EFFECTS OF INVENTION

According to the above constitution, an image tolerable for measurements (or an image intolerable for measurements) can be selected arbitrarily from a plurality of images obtained as a result of manipulating image quality and, besides, with a standard of the selected image, a decision can be made as to whether the optical axis adjustment is necessary, thereby ensuring that a decision can be made as to whether the optical axis adjustment is necessary without constant supervision of the charged particle beam device by an SEM operator in equivalent conditions as if the supervision is present.

BRIEF DESCRIPTION OF DRAWINGS

FIG. 13 is a diagram for explaining an example where image quality evaluation values are indicated along with pattern measurement results.

DESCRIPTION OF EMBODIMENTS

Figure 1:
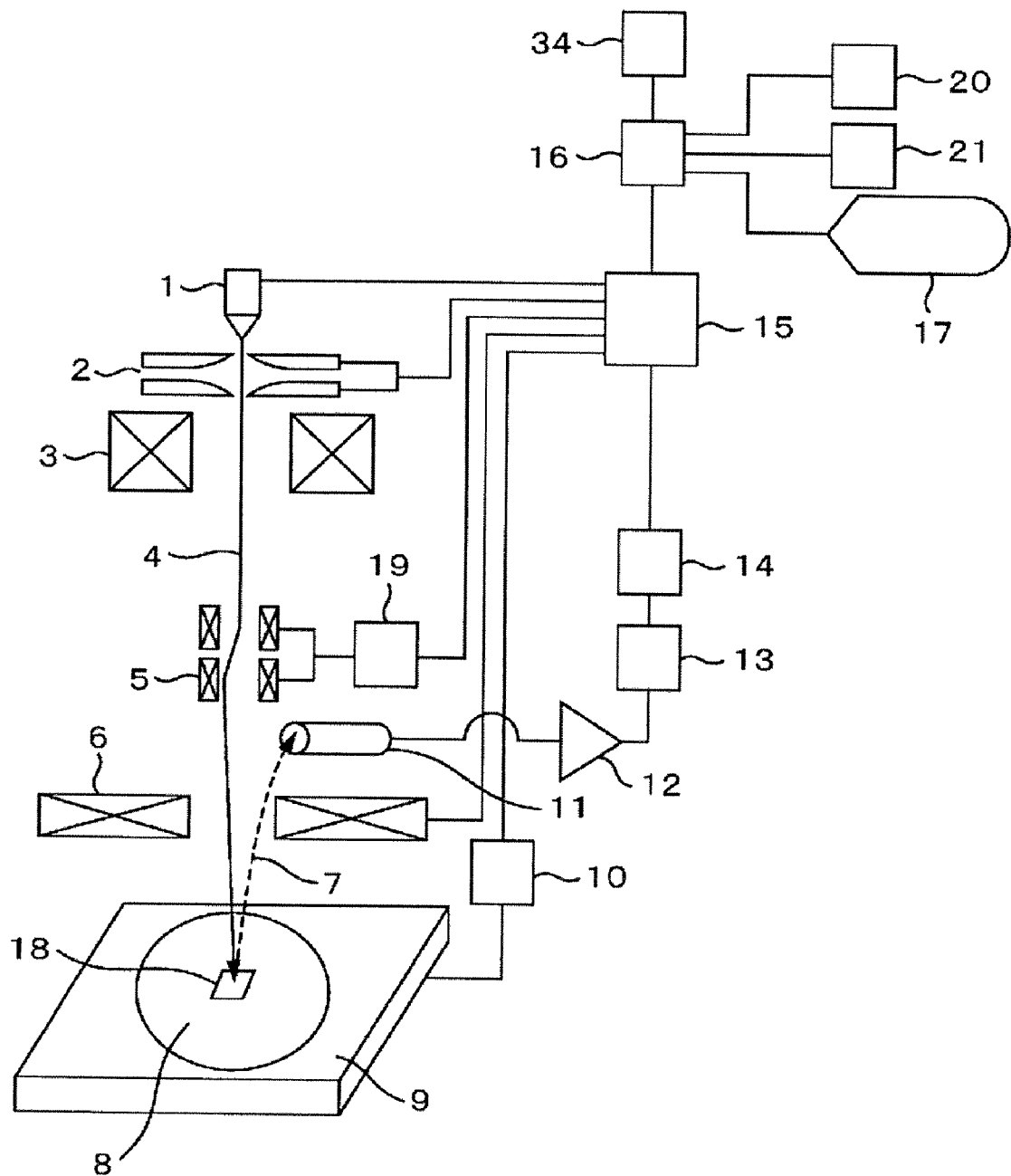
FIG. 1 is a diagram of the basic construction of a scanning electron microscope.

An embodiment will be described hereunder by way of an example of a scanning electron microscope but it is not limited thereto and the application to another charged particle beam device such as a scanning ion microscope is possible.
Embodiment 1
Preferably, in a critical dimension SEM (CD-SEM) representing one of measurement and inspection devices for semiconductor devices, the optical axis is adjusted automatically, an image quality is then confirmed with eyes, and measures such as readjustment is taken if needed. In a measurement device which operates for a long time, however, unattended operation is preferably carried out as far as possible.
Then, a method and algorithm for quantifying a subjective judgment of an SEM operator and, on the basis of the quantified judgment criterion, making a decision as to whether the axis adjustment is necessary will be described hereinafter.
More specifically, as maintenance before the onset of usual measurement with a critical dimension SEM, manpower is needed to confirm image quality with eyes after completion of automatic axis adjustment, to determine as to whether a readjustment is necessary, and to execute readjustment as well. A system is proposed which can eliminate quality determination and a repetitive task which requires work time by humans such as just described so that unattended operation of the axis adjustment of a critical dimension SEM may be achieved.
Incidentally, to quantify the judgment criterion, an arbitrary image is selected from a plurality of images captured when an optical element adapted to adjust the charged particle beam of SEM is changed. In this step, an arbitrary image is selected from images captured when the conditions of the optical element is changed stepwise. The SEM operator can judge appropriateness of images according to the degree of blur of an image and a selection of an image based on a subjective judgment criterion of the operator becomes possible.
Incidentally, the following description will be given by way of an example where out of images with tolerable blur the most blurred image (in the following description, referred as an image having an extreme blur amount) is selected in the aforementioned image selection step but it is not limited thereto; for example, out of images with subjectively intolerable blur the least blurred image may be selected. In this case, when an image evaluation value falls below that obtained from the image, the optical axis adjustment may be conducted. Further, for an image for acquiring an image evaluation value, a critical image within a range of tolerable or intolerable blur is not necessarily selected but, for example, by anticipating a margin to some extent, an image less blurred than an image having an extreme blur amount may be selected. Also, in this case, on the assumption that a further margin is included, a prescribed value may be added to or subtracted from the image evaluation value to determine an image evaluation value representing a threshold value.
To confirm a degree of blur of a selected image (to calculate an image evaluation value amount) on the basis of the subjective judgment of the operator as described previously, the FFT method is employed in the present embodiment. Depending on the magnitude of the evaluation value obtained through the FFT method, the magnitude of a blur amount can be judged. By using this method, images are blurred artificially in advance and an image having a tolerable extreme blur amount is subjected to FFT to determine its evaluation value. With the value registered as a threshold value, evaluation based on the FFT method is carried out and an evaluation value is compared with the threshold value during a periodical automatic axis adjustment, with the result that human tasks in a quality judgment and readjustment after the automatic adjustment of the device can be eliminated. In the present embodiment, a method for setting a threshold value is proposed and a system for unattended operation of the axis adjustment of an electron microscope is proposed.

Standards of adjustment conditions of devices desired to be maintained for semiconductor mass-production differ for semiconductor devices to be manufactured, manufacture process, and the like. A device adjustment condition management system is proposed which enables a user to select an arbitrary blur amount and adds the image quality judgment and the execution of readjustment based on comparison of an image quality evaluation with a threshold value to the automatic adjustment sequence. For blurring, a method for defocusing by changing the current value of an objective lens is proposed; otherwise, a method may be employed for blurring images by shifting the current values of an aligner or a stigmator coil. Further, in the case of an SEM adopting a so-called retarding process of suppressing landing energy of an electron beam reaching a sample by applying a negative voltage to the sample, the degree of blur of an image may be changed through so-called retarding focus for adjustment of focus by changing the retarding voltage. In such an instance, the optical element is an electrostatic lens formed by an electric field.

According to the scanning electron microscope device of the present embodiment, the optical condition of the device can be placed for a long time in a condition better than an tolerable limit selected by a user while being unattended. As a result, confirmation work done by work force can be eliminated and unattended operation of the device can be achieved.

A critical dimension SEM system capable of setting a threshold value used for quality judgment of the axis condition by using the aforementioned method will now be described in the present embodiment by making reference to the accompanying drawings.

FIG. 1 is a diagram of a schematic construction of a scanning electron microscope. An electron beam 4 extracted from an electron source 1 by extraction electrodes is accelerated by accelerating electrodes 2 and irradiated on a sample 8 such as a semiconductor wafer. Until reaching the sample, the electron beam 4 is converged by a condenser lens 3, deflected by a scanning deflector 5, applied with a focusing action by an objective lens 6 and thereafter scanned on the sample 8.

Electrons 7 emitted from a scanned area 18 on the sample 8 (secondary electrons and/or backscattered electrons) are detected by a detector 11 and a detection signal output from the detector 11 is amplified by an amplifier 12 and stored in an image memory unit 13. On the basis of an image signal stored in the image memory unit 13, length measurement of a pattern is carried out in a length measurement processing unit 14. A sample stage 9 for mounting the sample is configured to be able to move at least in X-Y directions when the electron beam optical axis is defined as in Z direction so that the electron beam 4 can be irradiated at a desired position on the sample 8.

Besides, the scanning electron microscope exemplified in FIG. 1 is provided with an aligner for optical axis adjustment (deflector), which is not shown, so that it is possible to adjust the optical axis with respect to optical elements such as the objective lens 6 and a stigmator, which is not shown. Further, the scanning deflector 5 and the sample stage 9 can be subjected to certain control by a deflection control unit 19 and a stage control unit 10, respectively.

The respective constituent components of the above-described scanning electron microscope are connected to a main control unit 15 so as to undergo certain control. A computer unit 16 is connected to the main control unit 15 and conducts arithmetic operations in accordance with programs for performing image processings, operations, and the like to be described later. To the computer unit 16 a memory medium 34, a mouse 20, a keyboard 21 and a display unit 17 are connected and an operator can carry out setting and selection using units such as the mouse 20 and the keyboard 21 based on information displayed on the display unit 17.

In the length measurement processing unit 14, dimension measurement is conducted using a pattern image stored in the image memory unit 13; it is configured so that at that time a filter parameter (function) for matching features of image profiles among devices (different SEM's) which is stored in advance in a memory means is read out, an image profile is generated from the captured pattern image using the read-out filter parameter, and the dimension of the pattern can be measured.

Figure 2:
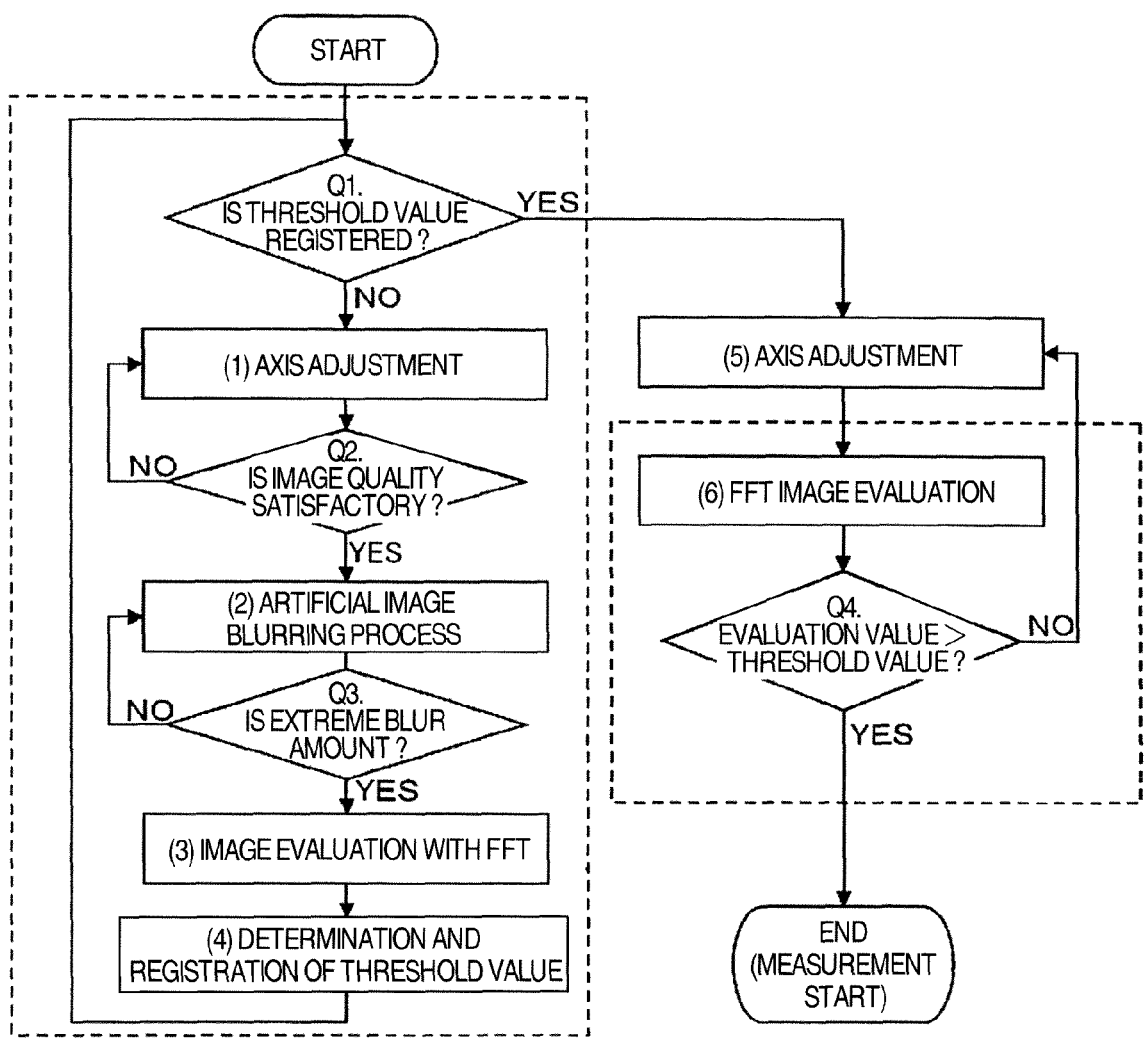
FIG. 2 is a flowchart for explaining procedures to obtain an image evaluation threshold value for an optical axis adjustment and image evaluation procedures based on the image evaluation threshold value.
Figure 3:
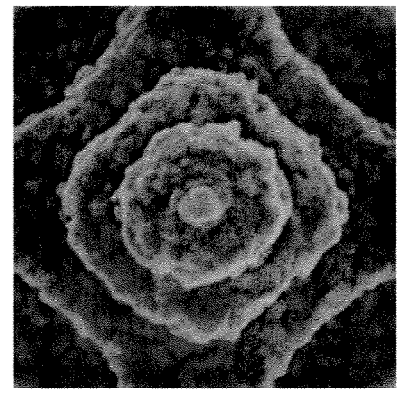
FIG. 3 is a diagram for explaining an example of a sharp SEM image.
Figure 4:
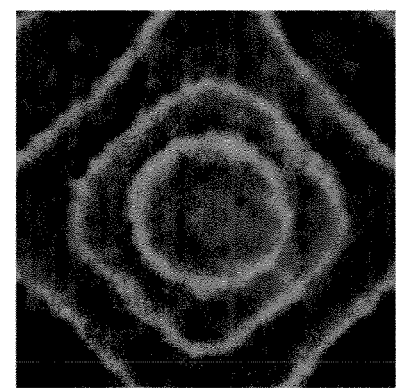
FIG. 4 is a diagram for explaining an example of a blurred SEM image.

FIG. 2 is a flowchart for explaining procedures to obtain an image evaluation threshold value for an optical axis adjustment and image evaluation procedures based on the image evaluation threshold value. In FIG. 2, the steps enclosed by dotted lines on the left side are the steps for obtaining the image evaluation threshold value and the steps enclosed by dotted lines on the right side are the steps for making a decision as to whether the optical axis adjustment is necessary based on the image evaluation threshold value. It is preferable that as maintenance before the onset of measurement with the critical dimension SEM image quality is confirmed with eyes after completion of automatic axis adjustment. For example, when an image can be observed sharply as shown in FIG. 3, the axis condition is determined as satisfactory and the normal use of the critical dimension SEM is started. But, when an image is observed blurred as shown in FIG. 4, the observer again executes the automatic axis adjustment process, which is repeated until it is confirmed that there is no problem in the image quality.

For the purpose of eliminating the quality judgment which requires human work time and repetitive tasks for the purpose of unattended operation of the critical dimension SEM as described above, obtaining the image evaluation threshold value for optical axis adjustment and the image evaluation based on the image evaluation threshold value as exemplified in FIG. 2 are proposed in the present embodiment.

The individual steps of the sequence in FIG. 2 are now described.

First, an initial setting is explained. In Q1, it is judged whether a threshold value has been registered. Initially, it proceeds to a flow of NO.

(1) Axis Adjustment

The axis adjustment is carried out. Also, correction of astigmatism, focusing, and the like are executed concurrently as other image quality corrections.

(2) Artificial Image Blurring Process

Figure 5:
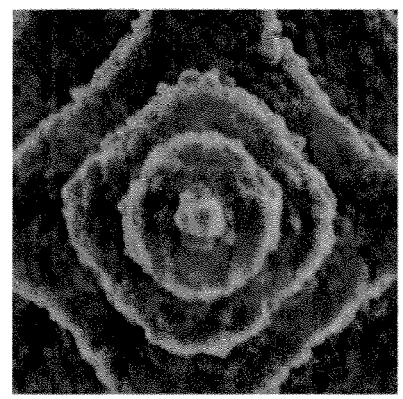
FIG. 5 is a diagram for explaining an example of an SEM image having tolerable blur evaluation values.

After the axis adjustment condition is confirmed with eyes as being satisfactory, the image is blurred artificially by changing the current amount of the objective lens 6. Thereafter, as in Q3, an observer judges with eyes whether the image has a tolerable extreme blur amount. If there is still room in the image blurs compared with the extreme, further blurring work is conducted. On the contrary, if the blur amount is too large, the blur amount is readjusted. An image blurred slightly more than in the condition of FIG. 4 by changing the objective lens is shown in FIG. 5, which shows an image having the extreme blur amount.

(3) Image Quality Evaluation with FFT

The image quality evaluation of the thus determined image having the extreme blur amount is subsequently executed through the FFT method. In the FFT method, frequency analysis is conducted by a two-dimensional Fourier transform on a two-dimensional shaded image. The image evaluation procedure is as below. First, a shaded image is converted into a digital image which in turn is subjected to two-dimensional Fourier transform. A real part and an imaginary part are square summed and an image having logarithmic values at individual pixels becomes an image after Fourier transform. By taking brightness of the image in a direction within the image, a frequency spectrum in the direction can be obtained. By using a signal intensity of a specific frequency component as an index value in the frequency spectrum, evaluation of the image at an arbitrary angle is possible. The procedure is shown in a schematic diagram of FIG. 6.

Figure 6:
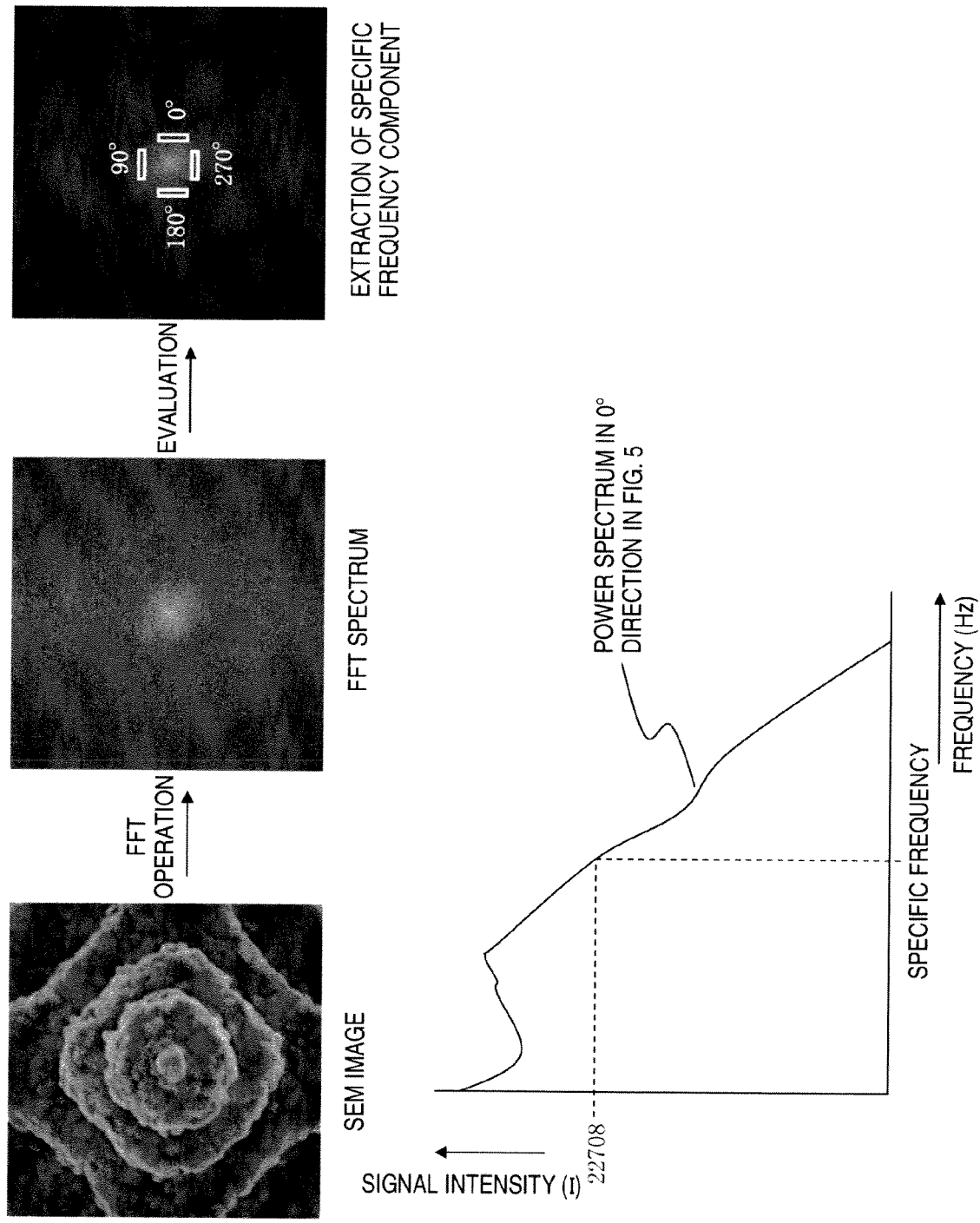
FIG. 6 is a diagram for explaining an example of an image evaluation process based on the FFT.

In the present embodiment, an instance is shown in which specific frequency components are extracted in four directions and they are averaged. FIG. 6 is a diagram for explaining the flow of the process. In FIG. 6, directions of 0°, 90°, 180°, and 270°, are set and components in these directions are averaged. As illustrated in a graph, a signal amount I at a specific frequency is recorded. In the graph, a spectrum diagram in 0° direction is illustrated. The result is indicated in a first row in a table of FIG. 7.

(4) Registration of Threshold Value

After an evaluation value of a blur amount is determined in the method explained in (3), it is registered as a threshold value (ITH) in the memory unit of the critical dimension SEM. In the case of this embodiment, the ITH calculated from FIG. 5 is 22087 as calculated in FIG. 7. This threshold value is used in a step (6) to be described later.

Up to here, the initial setting ends. Incidentally, in the present embodiment an example of directly registering the value obtained in (2) as the threshold value (image quality evaluation value) is explained but it is not limited thereto. An image quality evaluation value may be calculated by adding or subtracting a certain value; or not the direct value but an evaluation value allotted to each of prescribed value ranges may be used as an image quality evaluation value.

(5) Execution of Optical Axis Adjustment

Since the initial setting is complete at the step (4), the axis adjustment as a maintenance process which is intended to start the use of the critical dimension SEM is carried out. Its process is the same as that executed in (1).

(6) FFT Image Evaluation

Figures 7, 8:
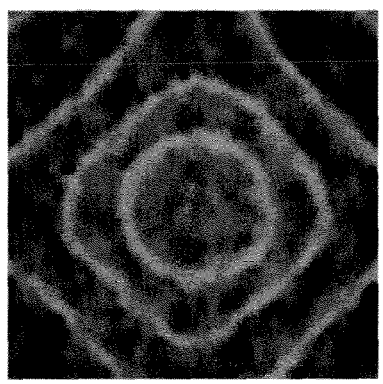
FIG. 7 is a diagram for explaining an example of image evaluation results based on the FFT.
FIG. 8 is a diagram for explaining an example of an image obtained for the purpose of evaluating the optical axis condition.
Figure 9:
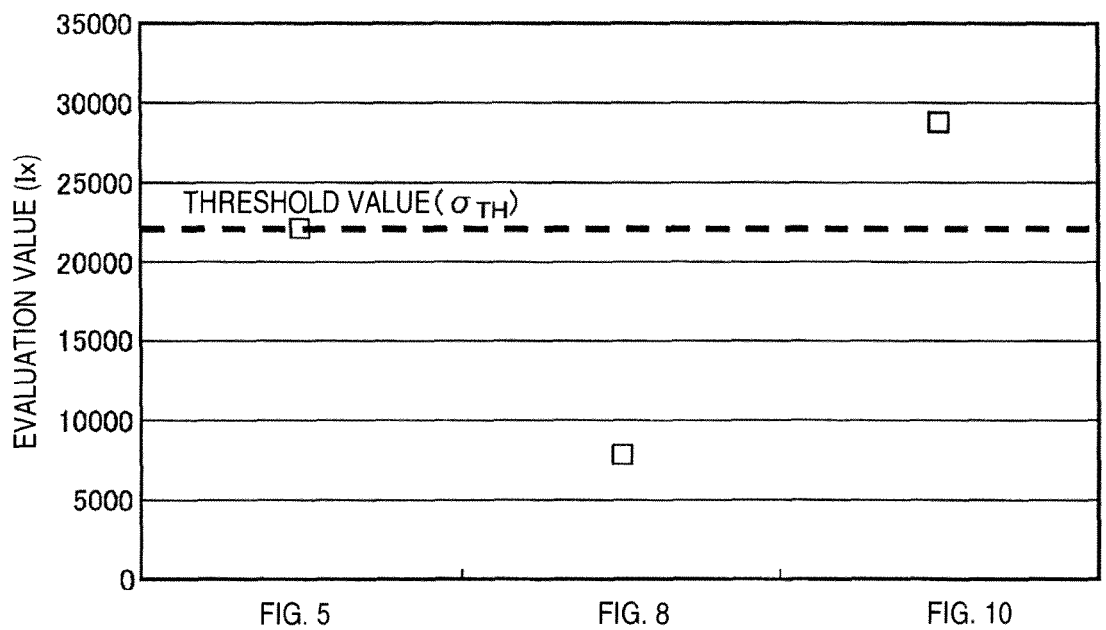
FIG. 9 is a diagram for explaining an example of a graph showing the relation between an image evaluation threshold value and an evaluation value of a captured image.
Figure 10:
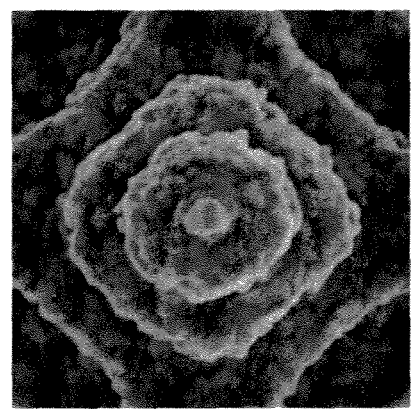
FIG. 10 is a diagram for explaining an example of an image captured for evaluation of the optical axis condition.

After the automatic axis adjustment is complete in (5), automatic image acquisition is carried out. For example, it is assumed that an image as shown in FIG. 8 is captured. Like the procedure in (3) above, a FFT evaluation value (Ix) is determined. The result is indicated in a second row in FIG. 7. Thereafter, a difference from a threshold value (Ix−ITH) is determined. If the difference is a positive value in the step of Q4, the axis condition is determined as satisfactory and it proceeds to ordinary pattern dimension measurement. If the difference is a negative value, the axis adjustment is carried out again. In FIG. 9 the results of the evaluation value (Ix) of FIG. 8 and the threshold value (ITH) set in FIG. 5 are shown graphically. In this case, since Ix is smaller that ITH, the processing returns to the automatic axis adjustment in the step (5). The result shown in a third row in FIG. 7 is obtained for an image shown in FIG. 10 and the steps (6) and Q4 are repeated until ITH is exceeded as seen there.

Originally, evaluation and judgment corresponding to (6) and Q4 are conducted artificially but through the above method only with judgment by an observer in Q1 to Q3 the subsequent processings can be automated.

Figure 11:
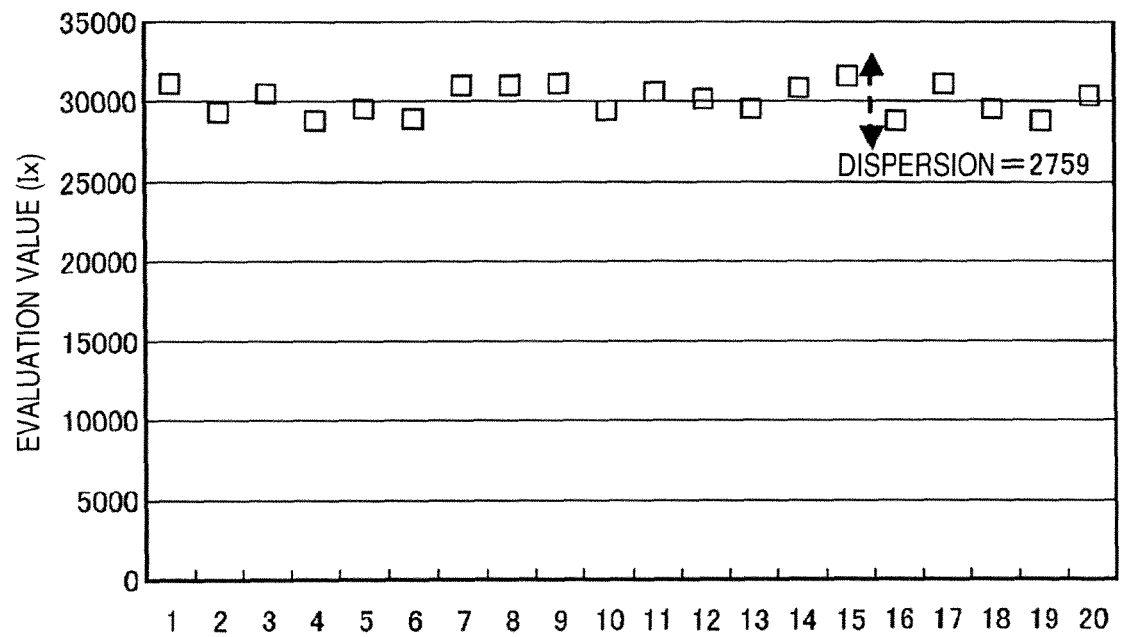
FIG. 11 is a diagram for explaining an example where evaluation values of captured images are dispersed because of causes attributable to samples.

Incidentally, even with similar image qualities FFT evaluation generates dispersions depending on individual differences of objects for which images are captured. An example to this effect is shown in FIG. 11 graphically. It is possible to set a threshold value in consideration of dispersions originating from the sample by investigating such dispersions in advance under the satisfactory axis condition and adding at registration of a threshold value in (4). For example, the ITH in the aforementioned example can be calculated as 22087+2759=24846.

For image quality evaluation based on the FFT, it is recommended to use patterns having equivalent brightness in all directions but a plurality of patterns in a specific direction may also be used.

Further, while in the present embodiment the image quality evaluation value is calculated using the FFT method, it is not limited thereto and, for example, a value obtained on the basis of the resolution evaluation method as explained in Patent Literature 3 can be used as an image quality evaluation value or a standard for calculation of an image quality evaluation value.

Embodiment 2

Another embodiment will now be described with reference to the accompanying drawings below.

In the present embodiment, it is intended that image quality evaluation values at individual measurement points are output as auxiliary information of dimension measurement results in a critical dimension SEM. In this method, propriety of the measurement results can be taken into account.

Figure 12:
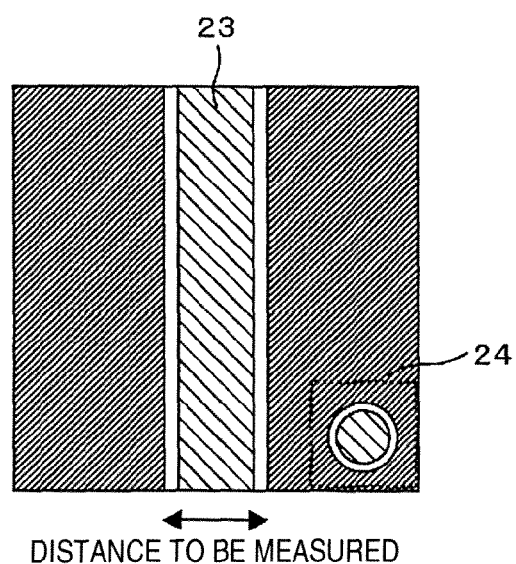
FIG. 12 is a diagram for explaining an example of a pattern for image quality evaluation disposed near a measured pattern.
Figure 14:
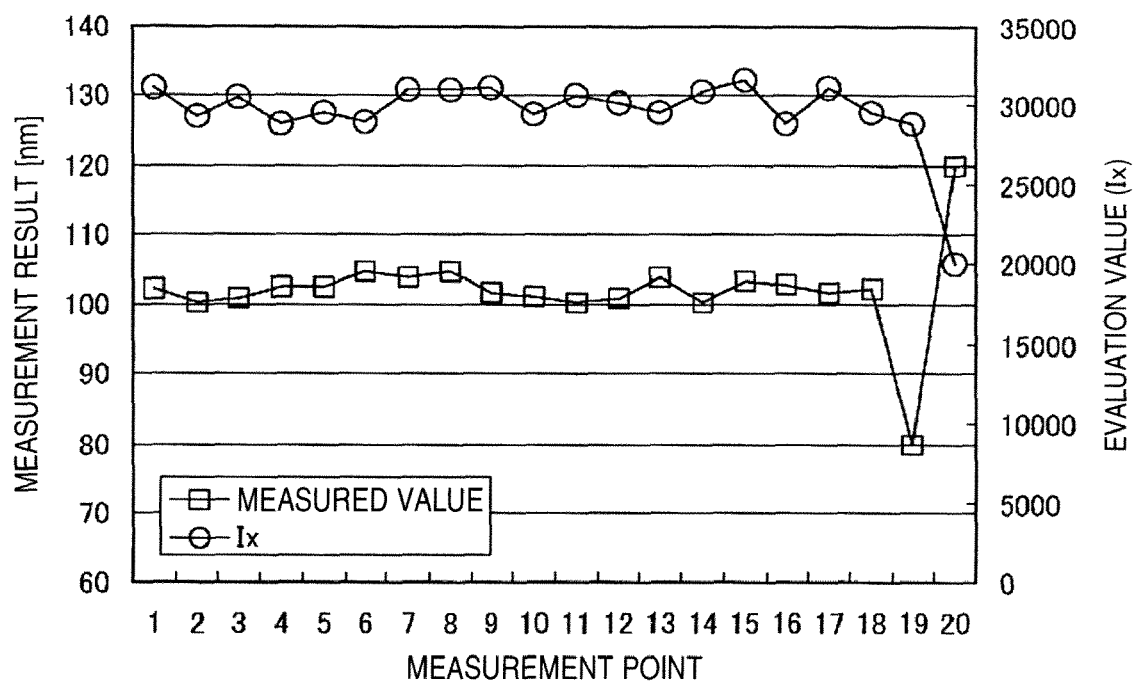
FIG. 14 is a graph showing pattern measurement results and image quality evaluation values.

As exemplified in FIG. 12, a circular pattern is prepared on a measurement sample adjacent to the pattern which is a measurement object. In the critical dimension SEM, the beam is scanned in such a manner that the circular pattern and the measurement object are included in the same field of view (FOV). After measurement based on image processing with the critical dimension SEM is complete, data of a region of the circular pattern is cut out and the FFT evaluation of this part is carried out. When a similar process is executed at all measurement points, image quality evaluation results are outputted along with results of the dimensions as shown in FIG. 13. These values are plotted graphically as shown in FIG. 14.

Out of 20 points, points 1 to 18 yield approximately dimensions of 100 nm but a nineteenth point yields 80 nm and a twentieth point yields 120 nm. To discriminatively clarify whether these peculiar points take place owing to a cause attributable to the device or a difference in the physical dimension on the sample, Ix can be used as an indicator. In FIG. 14, it is seen that the Ix value of the nineteenth point is equivalent to that of other points. This, therefore, means that the difference in a dimension does not result from an image blur. The Ix value of the twentieth point is, however, greatly different from those of other points. Accordingly, it is determined that an erroneous measurement due to image blur occurs, thus providing a trigger for eliminating data.

Embodiment 3

Still another embodiment will now be described with reference to the accompanying drawings below.

In the embodiments 1 and 2 the current amount of the objective lens 6 is changed manually in setting the threshold value. Here, the automatic image collecting function is used in order that the device swings the current amount automatically, arranges images which change stepwise on the screen for user confirmation, and designates an image capture condition in advance.

Figure 15:
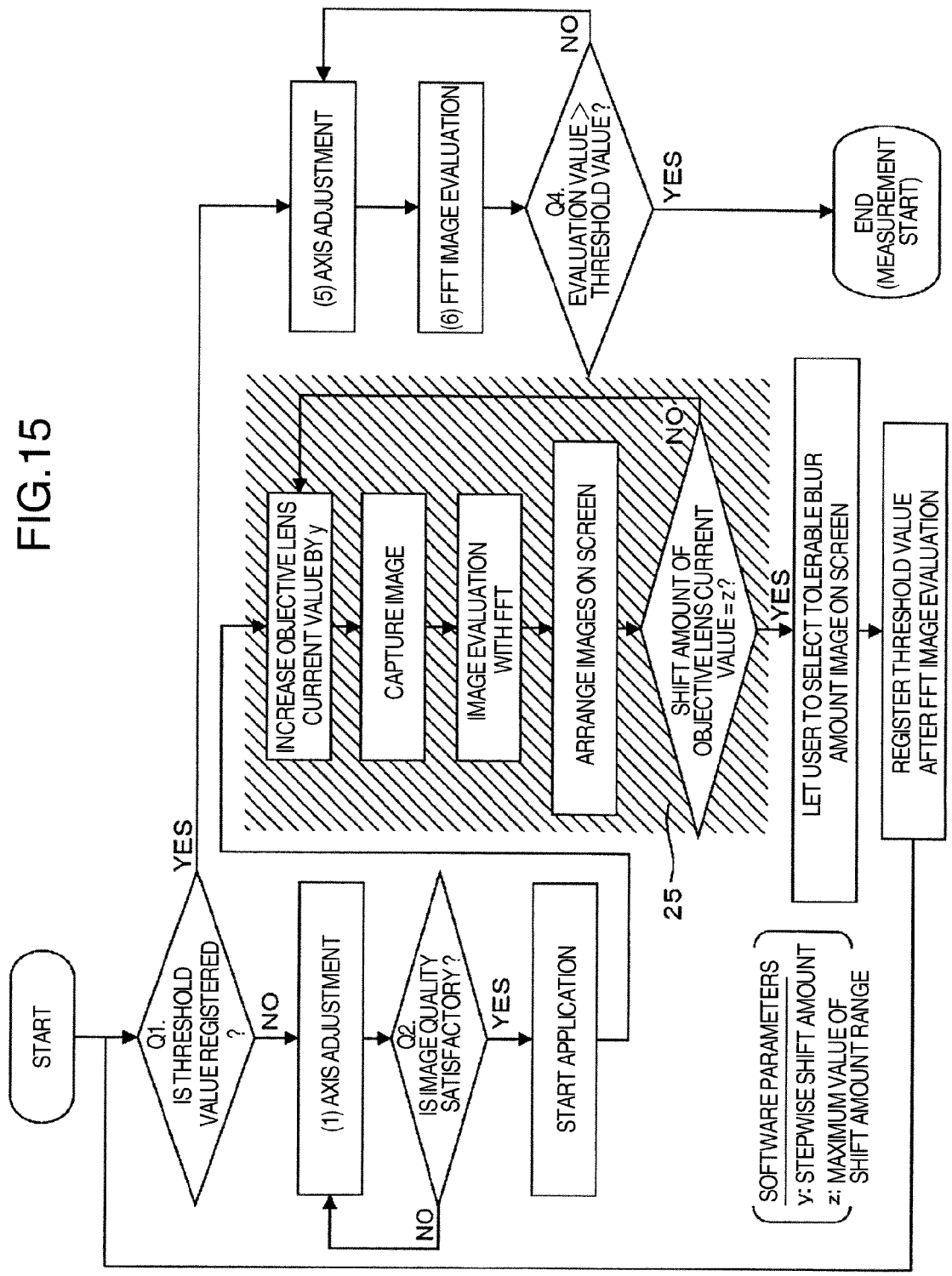
FIG. 15 is a flowchart for explaining a process of setting an image evaluation threshold value by using GUI (Graphical User Interface).
Figure 16:
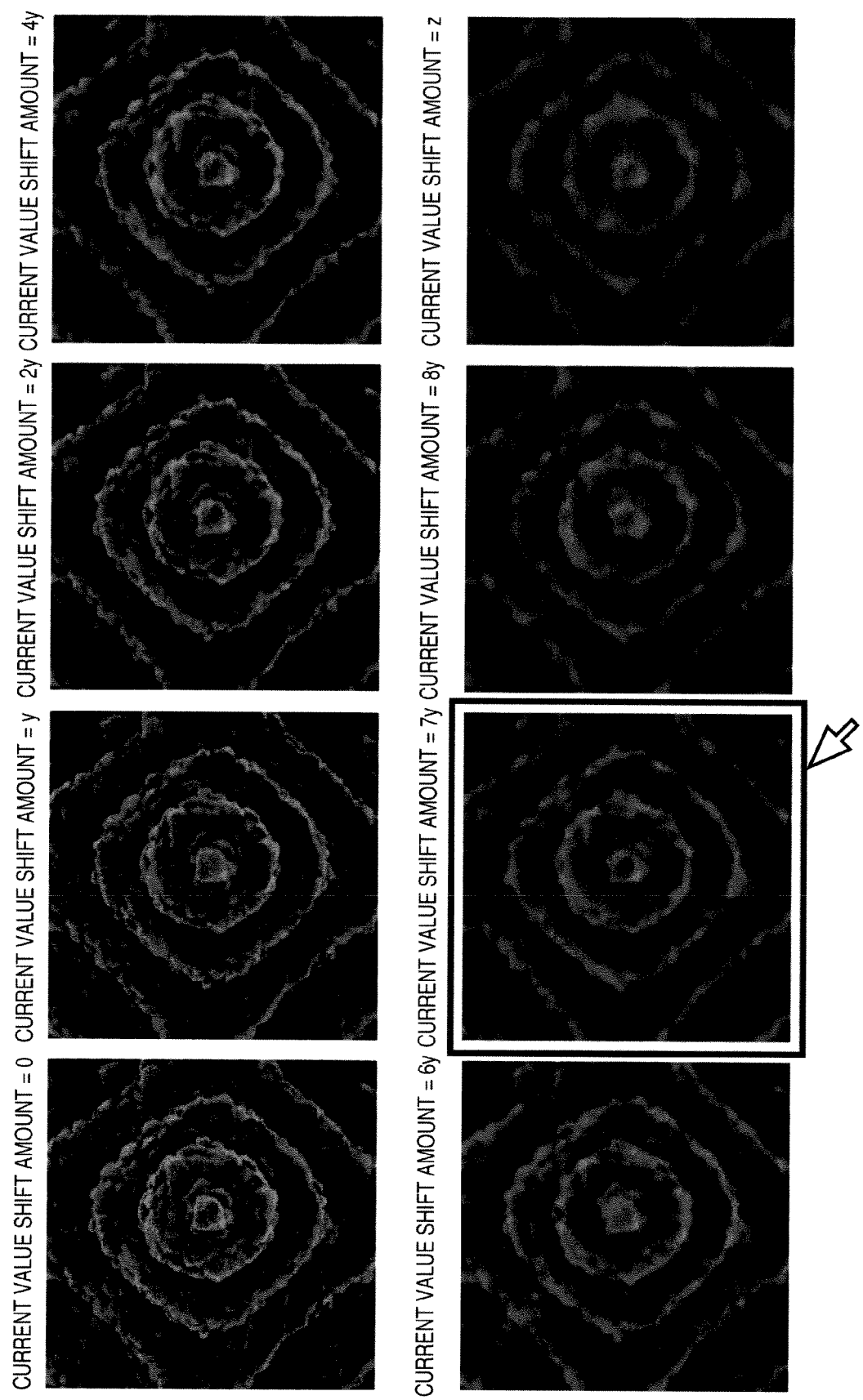
FIG. 16 is a diagram for explaining an example of display of plural images captured when an optical element is changed in multiple manners.

An operator moves to an arbitrary image-capture location, focuses, and subsequently confirms an image. Thereafter, the automatic image collecting function is started under the in-focus condition. The sequence is illustrated in FIG. 15. In this sequence, capture of an image is repeated with the objective lens current value automatically shifted stepwise slightly up to a certain range. The maximum shift amount z is built in software in advance and a method for determining the change amount will be proposed later. The number of steps is also incorporated and the amount y of a single step of the current shift amount is determined by dividing z by the number of images to make about 8 images be on the screen. The image acquisition conditions such as an electron beam operation method and the number of frame additions can be designated in advance through GUI. By arranging images changed stepwise on the screen, the user can compare visually the status of the images changing with the objective lens current shift. The GUI with the images arranged on the screen is shown in FIG. 16. The threshold value is also displayed together with the images to facilitate the prior designation of the image acquisition condition.

The aforementioned method for determining the maximum shift amount will now be described. Setting for using the whole range of the settable objective lens current value would prevent fine setting and would be unsuitable. Therefore, a change of the image quality when the objective lens current value is shifted is examined in advance and a suitable range is determined. If more detailed setting is desired, a relation between a length measurement value and a shift of focus is found out for an arbitrary pattern and a maximum shift amount can be set within a range in which a reproducibility desired for the device can be achieved.

REFERENCE SIGNS LIST

1 Electron source
2 Accelerating electrodes
3 Condenser lens
4 Electron beam
5 Scanning deflector
6 Objective lens
7 Emitted electrons
8 Sample
9 Sample stage
10 Stage control unit
11 Detector
12 Amplifier
13 Image memory unit
14 Length measurement processing unit
15 Main control unit

The invention claimed is:

1. A method for adjusting an optical axis in a charged particle beam device by deflecting a charged particle beam emitted from a charged particle source to perform optical axis adjustment, comprising the steps of:
   changing adjustment conditions of an optical element adapted to adjust said charged particle beam to thereby capture a plurality of images with said adjustment conditions different;
   selecting from said plurality of captured images an image whose image quality is tolerable or an image whose image quality is intolerable;
   obtaining a first image quality evaluation value on the basis of said selected image; and
   adjusting said optical axis when said obtained first image quality evaluation value is compared with a second image quality evaluation value obtained from an image captured by scanning said charged particle beam and said second image quality evaluation value is equal to or less than said first image quality evaluation value or is less than said first image quality evaluation value.

2. The method for adjusting an optical axis in a charged particle beam device according to claim 1, wherein said optical element is a condenser lens for converging said charged particle beam, a stigmator for correcting an astigmatism of said charged particle beam, or an electrostatic lens formed by applying a negative voltage to a sample.

3. The method for adjusting an optical axis in a charged particle beam device according to claim 1, wherein said charged particle beam is scanned such that a pattern to conduct said image quality evaluation and a pattern to conduct dimension measurement are included in a same field of view.

4. A charged particle beam device having a charged particle source, an alignment deflector for adjusting an optical axis by deflecting a charged particle beam emitted from said charged particle source, and a control unit for controlling said alignment deflector, comprising
   a selection unit for selecting an arbitrary image from a plurality of images captured when an adjustment condition of an optical element adapted to adjust said charged particle beam is changed, wherein
   said control unit calculates a first image evaluation value of an image selected by said selection unit, compares said first image evaluation value with a second image evaluation value determined from an image captured when said charged particle beam is scanned on a sample, and controls said alignment deflector so as to perform said optical axis adjustment when said second image quality evaluation value is equal to or less than said first image quality evaluation value or less than said first image quality evaluation value.

5. The charged particle beam device according to claim 4, wherein said optical element is a condenser lens for converging said charged particle beam, a stigmator for correcting an astigmatism of said charged particle beam, or an electrostatic lens formed by applying a negative voltage to a sample.

* * * * *